(12) United States Patent
Reis et al.

(10) Patent No.: US 7,129,421 B2
(45) Date of Patent: Oct. 31, 2006

(54) SOFT SURFACE MOUNT TECHNOLOGY COMPATIBLE EMI GASKET

(75) Inventors: Bradley E. Reis, Landenberg, PA (US); William F. Candy, Middletown, DE (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 10/313,989

(22) Filed: Dec. 6, 2002

(65) Prior Publication Data

US 2004/0216910 A1 Nov. 4, 2004

(51) Int. Cl.
*H05K 9/00* (2006.01)

(52) U.S. Cl. ............... 174/354; 248/231.81; 248/67.7; 277/920

(58) Field of Classification Search ......... 174/35 GC, 174/35 R, 35 MS, 354, 352; 439/927, 607, 439/609; 361/816, 818; 248/612, 65, 67.7, 248/231.9, 231.81; 277/920

See application file for complete search history.

(56) References Cited

U.S. PATENT DOCUMENTS

| 4,864,076 | A | * | 9/1989 | Stickney | ................. 174/35 GC |
| 4,968,854 | A | | 11/1990 | Benn, Sr. et al. | ........ 174/35 GC |
| 5,038,528 | A | * | 8/1991 | Brant | ............................. 52/11 |
| 5,068,493 | A | | 11/1991 | Benn, Sr. et al. | ........ 174/35 GC |
| 5,107,070 | A | | 4/1992 | Benn, Sr. et al. | ........ 174/35 GC |
| 5,120,903 | A | * | 6/1992 | Tam | ....................... 174/35 GC |
| 5,141,770 | A | | 8/1992 | Benn, Sr. et al. | ............. 427/58 |
| 5,250,751 | A | * | 10/1993 | Yamaguchi | ............. 174/35 GC |
| 5,394,306 | A | * | 2/1995 | Koenck et al. | ............. 361/809 |
| 6,073,896 | A | * | 6/2000 | McFadden | ............. 248/231.81 |
| 6,235,986 | B1 | | 5/2001 | Reis et al. | .............. 174/35 GC |
| 6,255,581 | B1 | | 7/2001 | Reis et al. | .............. 174/35 GC |

FOREIGN PATENT DOCUMENTS

| JP | 05021980 A | * | 1/1993 |
| WO | WO 99/22556 | | 5/1999 |

* cited by examiner

*Primary Examiner*—Hung V. Ngo
(74) *Attorney, Agent, or Firm*—Allan M. Wheatcraft

(57) ABSTRACT

An Electromagnetic Interference (EMI) gasket formed of a hollow, conductive material which is mechanically fastened to a metal support layer. The assembly can be installed using standard high speed SMT pick and place equipment.

5 Claims, 1 Drawing Sheet

SOFT SURFACE MOUNT TECHNOLOGY COMPATIBLE EMI GASKET

FIELD OF THE INVENTION

The present invention relates to an improved electromagnetic interference (EMI) gasket assembly. More particularly, the invention relates to an EMI gasket assembly that is soft and compatible with surface mount technology (SMT) installation.

BACKGROUND

An EMI gasket is an electrically conductive interface material that is used to connect an electrically conductive shield with a corresponding section of an electrical ground, such as a ground trace of a printed circuit board (PCB). The ground trace typically encircles components that either emit electromagnetic interference or are sensitive to such interference. Preferably, an EMI gasket should be highly electrically conductive and conformal under pressure. Once assembled, the gasket material mechanically (and thus, electrically) fills the gaps between the shield and ground trace, forming a Faraday Cage around the components, thereby shielding them from EMI.

Since the mating surfaces of both a shield and PCB are not perfectly parallel and flat (for tolerance reasons), gaps are created at the interface, which can leak EMI. Gaps can also result from flexing. An EMI gasket must be compressible so that it fills in these gaps, thereby consistently maintaining electrical contact between the shield and ground trace over the intended design range of tolerances and flexing. As cellular phones and other devices become smaller and lighter, the materials they are made from become more susceptible to this flexing. As market pressures continue to push pricing downwards, designers have been forced to loosen flatness specifications on shield and PCB parts, and decrease the number of typical screw fasteners (replacing them with snap features). Typically, previous shield and PCB designs have required approximately 0.2 to 0.3 mm of conformability (compression) out of an EMI gasket material. Today's designs are pushing that requirement more towards 0.4 to 0.6 mm, yet with less available force. These trends place a higher demand upon the EMI gasket, forcing it to be more compressible under lower forces (i.e. softer), yet still delivering proper electrical performance. This is pushing the very limits of EMI gasket technology.

Presently, EMI gaskets are almost exclusively installed directly onto the shield, as opposed to the PCB, and often must have a customized pattern for each application. These EMI gaskets are typically comprised of conductive particles in a binder, such as silicone. They are typically dense and difficult to compress, since they necessarily rely on the conductive particles to contact each other. Stamped metal parts with formed compressible spring-like 'fingers' are another type of gasket material, but these are known to have high-frequency performance issues due to the 'finger' spacing, as well as electrical reliability issues over time and exposure to elevated temperature and humidity. The present manufacturing techniques for installing such EMI gaskets include the following: dispensing a conductive particle-filled paste or liquid material directly onto the shield's surface and curing the dispensed material in-situ; die-cutting a conductive sheet material having an adhesive backer and then transferring, positioning and adhering the dimensioned material directly to the shield's surface; or mechanically fastening a conductive spring-like metal material to the shield's surface.

Conductive EMI gasket "ropes" have been developed to address the issue of softness. These are typically extruded tubes that are either somewhat homogeneously comprised of conductive particles in an elastomeric binder, or so-called "dual-extrusion" types which are comprised of a dielectric, elastomeric inner core and an electrically conductive outer layer, typically conductive particles in an elastomeric binder. Silicone is often used for the binder and/or core, due to its mechanical resiliency and high temperature resistance. These "ropes" can offer high compressibility with low forces, owing to their tube-like shape and hollow center (compression hole). Since they are extruded, however, they cannot be customized to complex, customized shapes, which limits their flexibility particularly in complicated handset designs. Using separate individual pieces of such a material can add design flexibility, but requires the use of an adhesive and complex peel-and-stick automation, which is cumbersome, difficult and often unreliable. Alternatively, a groove in the shield can be used to retain the tube or tube pieces, but this consumes significant space in a design, which is at a premium in handsets.

As is well understood by those skilled in the art, SMT (Surface Mount Technology) machines typically utilize a vacuum head on the end of a high-speed pick-and-place system to install tape-and-reel-fed PCB components onto surface-mount pads on a PCB. These pads are usually pre-screened with solder-paste (or conductive adhesive) and then sent through a reflow process (such as infrared-IR, vapor-phase, or convection) to melt the solder joints (or cure the adhesive), thereby forming an electrical and mechanical connection. As stated before, EMI gaskets are generally installed directly onto the shielding cover, which mates to a matching ground trace on the PCB. However, there is an SMT-compatible EMI gasket assembly that can be placed directly onto the PCB, and soldered (or bonded) to the ground trace. This gasket assembly can also be soldered or bonded to the shielding cover, as well, for additional flexibility. This type of gasket assembly is available under the trade name of GORE-SHIELD® SMT EMI gaskets. Gore's U.S. Pat. Nos. 6,235,986 and 6,255,581 are incorporated herein by reference. A typical SMT-compatible gasket assembly solution might be made up of a multitude of individual, gasket assemblies combined to form a more-or-less continuous gasket design, or just a few discrete assemblies used in selected areas, depending upon the shielding performance required. The benefits of this approach are well known, but include allowing for standard assembly sizes, design flexibility, speed of incorporating design changes, and providing a cost-effective way to add consistent, discrete point grounding to an EMI shielding scheme. These SMT-compatible EMI gasket assemblies have been particle-filled, which suffer from some of the same compressibility issues as dispensed type gaskets. What is needed for today's designs, however, is an SMT-compatible gasket assembly that is softer than existing products. This would allow for lighter, thinner, less expensive covers and housings with a larger range of tolerances, and allow for larger ranges of deflection, as described previously.

SUMMARY OF THE INVENTION

Figures 1, 2:
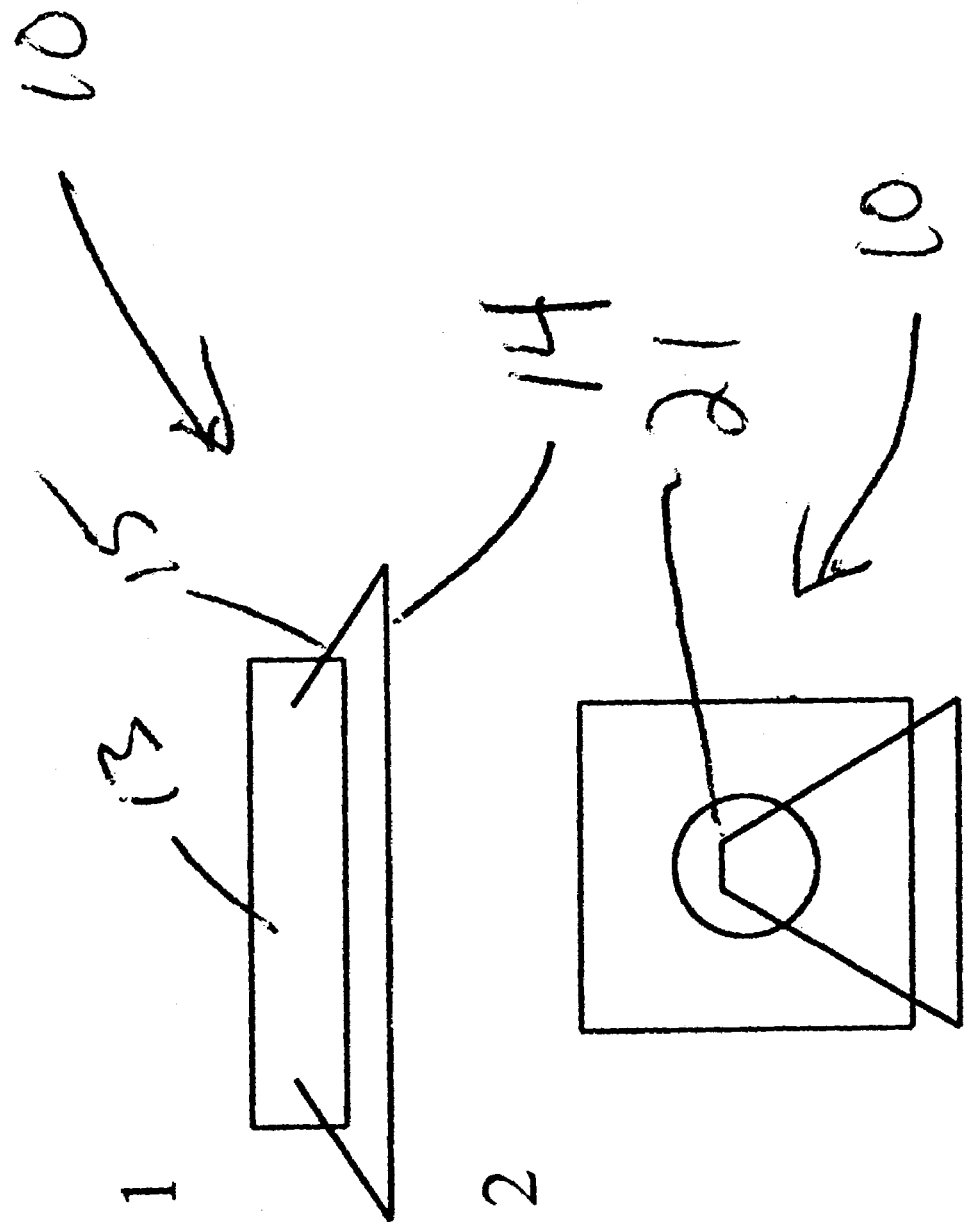
FIG. 1 is an enlarged side elevation view of the EMI gasket assembly of the present invention
FIG. 2 is an enlarged end view of the EMI Gasket assembly of the present invention

This invention provides a soft surface mount technology (SMT) compatible EMI gasket part comprising:
an electrically conductive gasket material;
an electrically conductive support layer;

wherein the electrically conductive gasket material has a compression hole; and wherein the electrically conductive support layer comprises at least one crimp feature; and wherein the at least one crimp feature penetrates the compression hole, thereby mechanically affixing the electrically conductive gasket material to the electrically conductive support layer.

In another aspect, this invention provides an electromagnetic interference gasket assembly comprising:

an electrically conductive gasket material having a compressed state and an uncompressed state;

an electrically conductive support layer adjacent the electrically conductive gasket material;

wherein the electrically conductive gasket material has a tubular shape in the uncompressed state; and wherein the electrically conductive support layer has at least one portion that is bent and that penetrates the electrically conductive gasket material, thereby mechanically affixing the electrically conductive gasket material to the electrically conductive support layer.

DETAILED DESCRIPTION OF THE INVENTION

Referring now to the drawings, the present invention provides an electromagnetic interference (EMI) gasket assembly 10, as shown in FIG. 1 and FIG. 2, which is soft and compatible with surface mount technology (SMT) installation. Gasket assembly 10 comprises an electrically conductive gasket material 13 and an electrically conductive support layer 14. Electrically conductive gasket material 13 comprises a compression hole 21, formed therein. Compression hole 21 is a hollow section of gasket material 13 that enhances its compressibility. Compression hole 21 may be produced during production of the gasket material 13 by such processes as extrusion, casting, or molding, or alternatively added as a post-production operation, such as die-cutting or punching. Suitable electrically conductive gasket materials may be fabricated from any known material. Particularly preferred are the following:

(1) an extruded particle-filled type EMI gasket material with a compression hole, as described in patent WO 99/22556; and (2) an extruded EMI gasket material comprising a dielectric, elastomeric inner core with a compression hole, and an electrically conductive outer layer at least partially surrounding the inner core, as described in patents U.S. Pat. Nos. 4,968,854, 5,068,493, 5,107,070, and 5,141,770.

As described previously, gasket assembly 10 further comprises an electrically conductive support layer 14. Support layer 14 is a material that gives stiffness to gasket material 13 and also provides an interface (other than the gasket material 13 itself) to allow for soldering or bonding. Support layer 14 also comprises at least one, but preferably two, crimp features 15. Crimp feature 15 is simply a shaped and formed section of support layer 14 which is to be used to mechanically attach gasket material 13 to support layer 14. Crimp feature 15 is formed to penetrate compression hole 21 and preferably to pinch end of gasket material 22, thereby securely attaching gasket material 13 to support layer 14 without negatively affecting the apparent softness of gasket material 13. Crimp feature 15 may be formed with a variety of shapes to maximize retention force of gasket material 13 to support layer 14. Crimp feature 15 may also be formed using a variety of processes, but is preferably formed by simply bending end of support layer 14 back upon itself at roughly 180 degrees. Care should be taken to ensure that gasket material 13 remains straight and parallel to support layer 14 during and after crimping process. Support layer 14 should impart sufficient stiffness to the flexible gasket material 13 for it to be effectively processed as a gasket assembly 10 using standard SMT machines. Additionally, support layer 14 should impart sufficient robustness to the crimp feature 15 such that it is not easily bent accidentally, thereby dislodging gasket material 13. Thus, support layer 14 may be made of a variety of different materials (such as plastic or metal), but is preferably made of copper or brass, and preferably plated with a highly conductive metal such as gold, silver, or tin. Support layer 14 may be any thickness, but is preferably in the range of about 0.01 to 0.50 mm thick. A preferred embodiment for the support layer 14 of the present invention is silver-plated copper-alloy metal, approximately 0.1 mm thick.

Gasket assembly 10 is affixed to either the PCB or the shield in an uncompressed state having compression hole 21. Gasket assembly 10 is then compressed between the PCB and the shield, collapsing compression hole 21.

Gasket material 13 and support layer 14 must be able to withstand temperatures required to ultimately attach the gasket assembly 10 to its desired substrate (e.g. ground trace or shield) without negatively affecting its electrical and mechanical performance. This attachment process might preferably involve solder reflow or adhesive curing.

Typically, the attachment process begins by using tape-and-reel packaging to feed the EMI gasket assembly 10 into an SMT machine. The gasket assemblies 10 are received in embossed tape-and-reel pockets (not shown), which are positioned to allow a vacuum head of an SMT machine to easily and precisely access and pick up the gasket assemblies 10 from their respective pockets in the packaging, for placement. The ground trace or conductive shield surface may be prepared with a screened pattern of solder paste (or conductive adhesive), to mate with the support layer 14 of the assembly. Once the gasket assembly 10 is deposited on the ground trace or shield (with the support layer side in engagement with the solder paste or adhesive), the solder is reflowed (or the adhesive is cured), by any suitable means such as a reflow oven process, for example.

While advantageous embodiments have been chosen to illustrate the invention, it will be understood by those skilled in the art that various changes and modifications can be made therein without departing from the scope of the invention as defined in the appended claims.

What is claimed is:

1. A surface mount technology compatible EMI gasket assembly comprising:

an electrically conductive gasket material having at least one end;

an electrically conductive support layer disposed parallel to said gasket material;

wherein said electrically conductive gasket material comprises a compression hole; and wherein said electrically conductive support layer comprises at least one crimp feature; and wherein said at least one crimp feature penetrates said compression hole at said at least one end without penetrating said conductive gasket material, thereby mechanically affixing said electrically conductive gasket material to said electrically conductive support layer.

2. The gasket assembly set forth in claim 1, wherein said electrically conductive gasket material further comprises an elastomer filled with conductive particles.

3. The gasket assembly set forth in claim 1, wherein said electrically conductive gasket material further comprises a dielectric, elastomeric inner core, and an electrically conductive outer layer at least partially surrounding said dielectric, elastomeric inner core.

4. The gasket assembly set forth in claim 1, wherein said support layer is made of copper or a copper alloy, plated with gold, silver, or tin.

5. An electromagnetic interference gasket assembly comprising:
   an electrically conductive gasket material having at least one end, and having a compressed state and an uncompressed state;
   an electrically conductive support layer adjacent and parallel to said electrically conductive gasket material;
   wherein said electrically conductive gasket material has a tubular shape in said uncompressed state; and
   wherein said electrically conductive support layer has at least one portion that is bent and that penetrates said electrically conductive gasket material at said at least one end without penetrating said conductive gasket material, thereby mechanically affixing said electrically conductive gasket material to said electrically conductive support layer.

* * * * *